US010790918B2

(12) United States Patent
Jacob et al.

(10) Patent No.: US 10,790,918 B2
(45) Date of Patent: Sep. 29, 2020

(54) DETECTION FOR DIGITAL RADIO MONDIALE PLUS IN HYBRID BROADCASTING MODE

(71) Applicant: NXP B.V., Eindhoven (NL)

(72) Inventors: Naveen Jacob, Bangalore (IN); Rajesh Kurian, Bangalore (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/420,417

(22) Filed: May 23, 2019

(65) Prior Publication Data

US 2019/0372694 A1 Dec. 5, 2019

(30) Foreign Application Priority Data

May 29, 2018 (EP) .................................... 18174706

(51) Int. Cl.

*H03D 7/00* (2006.01)
*H04H 60/25* (2008.01)
*H04H 20/57* (2008.01)
*H04H 60/27* (2008.01)

(52) U.S. Cl.

CPC ............ *H04H 60/25* (2013.01); *H04H 20/57* (2013.01); *H04H 60/27* (2013.01); *H04H 2201/12* (2013.01)

(58) Field of Classification Search

CPC ........... H04H 2201/11; H04H 2201/12; H04H 2201/20; H04H 40/27
USPC .......................................................... 455/703
See application file for complete search history.

(56) References Cited

U.S. PATENT DOCUMENTS

| | | | | |
|---|---|---|---|---|
| 6,490,235 | B1 | 12/2002 | Iida | |
| 9,083,569 | B2 | 7/2015 | Jeon et al. | |
| 2013/0163703 | A1* | 6/2013 | Jeon | H04L 27/0012 375/343 |

FOREIGN PATENT DOCUMENTS

| | | | |
|---|---|---|---|
| EP | 1998447 | A2 | 12/2008 |
| WO | 2010007581 | A1 | 1/2010 |

OTHER PUBLICATIONS

Kim, S.,, "Detection Method for Digital Radio Mondiale Plus in Hybrid Broadcasting Mode", IEEE 2013.

* cited by examiner

*Primary Examiner* — Tu X Nguyen

(57) ABSTRACT

A radio receiver is disclosed. The radio receiver includes an analog tuner and a baseband processor to provide radio functions. The baseband processor is coupled to the analog tuner. The radio receiver further includes a memory, a controller coupled to the analog tuner, the baseband processor and the memory. The controller is configured to perform an operation, the operation includes causing the analog tuner to analyze a selected FM frequency to determine if the selected FM frequency is associated with a digital radio mondiale (DRM) plus station by first coarsely determine if the selected FM frequency may be associated with a DRM plus station and if coarse determination fails, marking the FM frequency as not being associated with a DRM plus station, wherein if the coarse determination is successful, retrying a selected number of times to continue to determine if the selected FM frequency is associated with a DRM plus station.

7 Claims, 2 Drawing Sheets

DETECTION FOR DIGITAL RADIO MONDIALE PLUS IN HYBRID BROADCASTING MODE

CROSS-REFERENCE TO RELATED APPLICATIONS

This application claims the priority under 35 U.S.C. § 119 of European Patent application no. 18174706.4, filed on 29 May 2018, the contents of which are incorporated by reference herein.

BACKGROUND

Digital Radio Mondiale (DRM) is a set of digital audio broadcasting technologies designed to work over the frequency bands currently used for analog radio broadcasting including Amplitude Modulation (AM) broadcasting, particularly shortwave, and Frequency Modulation (FM) broadcasting. DRM is more spectrally efficient than AM and FM, allowing more stations, at higher quality, into a given amount of bandwidth, using various MPEG-4 audio coding formats.

Modern radio receiver systems typically include a visual display to display information to users. This information may include list of stations in different categories such as AM stations, FM stations and DRM stations. Program information associated with each program being broadcasted may also be included in the display.

Typically, the broadcast stations are scanned separately to obtain a list of different types of stations in a geographical area and the list must be updated in the case when a radio receiver system is mounted in a moving vehicle.

When a DRM receiver receives a FM signal, the receiver is unable to judge that the received signal is not a DRM plus signal. The receiver continuously tries to decode the signal as false alarm and the power consumption increases. In addition, the receiver is unable to display the information about the channel quickly to the user.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In one embodiment, a radio receiver is disclosed. The radio receiver includes an analog tuner and a baseband processor to provide radio functions. The baseband processor is coupled to the analog tuner. The radio receiver further includes a memory, a controller coupled to the analog tuner, the baseband processor and the memory. The controller is configured to perform an operation, the operation includes causing the analog tuner to analyze a selected FM frequency to determine if the selected FM frequency is associated with a digital radio mondiale (DRM) plus station by first coarsely determine if the selected FM frequency may be associated with a DRM plus station and if coarse determination fails, marking the FM frequency as not being associated with a DRM plus station, wherein if the coarse determination is successful, retrying a selected number of times to continue to determine if the selected FM frequency is associated with a DRM plus station.

In some examples, the coarse determination is performed by determining if the selected FM frequency is not associated with a FM channel. If the coarse determination results in success, the operation further includes attempting to decode primary control channel. If the primary control channel decoding is successful, the operation further includes decoding service info and payload data.

If the attempt to decode primary control channel is successful, the operation further includes playing the decoded payload data on a speaker. But, if the primary control channel decoding fails, the operation further includes invoking FM tuning and analyzing tuner metrics to determine that the selected FM frequency may be associated with a DRM plus station. And after analyzing, for a preselected number of times, the selected FM frequency for a DRM plus station using different occurrences of primary control channel each time, if a definite determination that the selected FM frequency is a DRM plus station fails, storing the selected FM frequency as a non DRM plus station in the memory.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments. Advantages of the subject matter claimed will become apparent to those skilled in the art upon reading this description in conjunction with the accompanying drawings, in which like reference numerals have been used to designate like elements, and in which:

Figure 1:
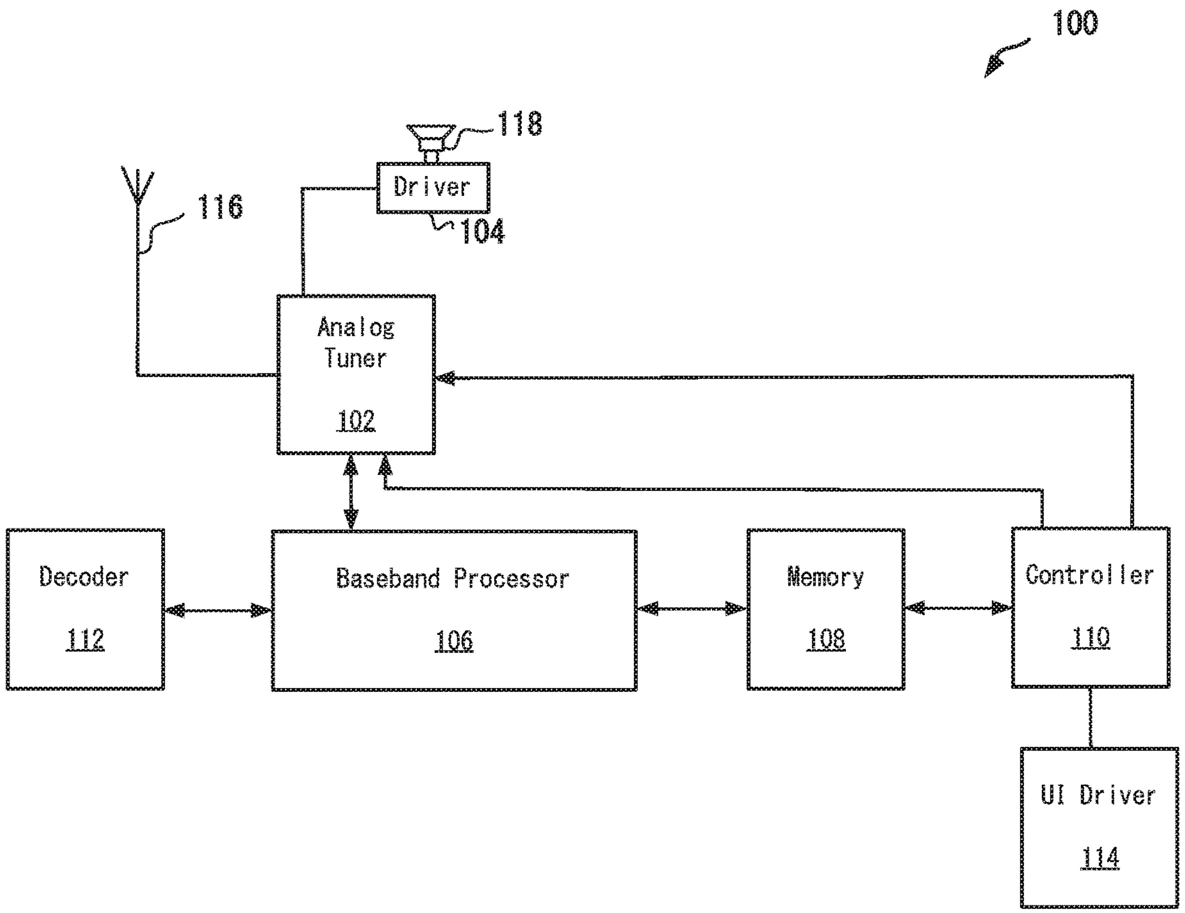
FIG. 1 shows a block diagram of a radio receiver in accordance with one or more embodiments.

Note that figures are not drawn to scale. Intermediate steps between figure transitions have been omitted so as not to obfuscate the disclosure. Those intermediate steps are known to a person skilled in the art.

DETAILED DESCRIPTION

Many well-known manufacturing steps, components, and connectors have been omitted or not described in detail in the description so as not to obfuscate the present disclosure.

A hybrid FM radio transmission uses FM frequency band for both FM and DRM plus channels. A DRM plus radio receiver needs to distinguish between a FM station and a DRM plus station. Detection of a DRM plus station is an involved process that typically takes approximately 300 ms. To quickly if a hybrid transmission mode is being employed, the embodiments herein use a coarse step to tentatively identify a radio station as DRM plus station by detecting signal characteristics that are unusual for a FM channel. For example, if a channel being analyzed exhibits higher modulation index than a typical FM channel or exhibits an erroneous metrics for ultrasound noise level (i.e., level of frequency components above 20 KHz audible spectra), the channel may be a DRM plus channel.

If the FM station is adjacent to a DRM plus station (i.e., half of the 200 KHz bandwidth is being used for FM channels and the remaining half for DRM plus channels) in a hybrid transmission mode, the FM tuning of the FM station will show modulation index reduced to half and bandwidth reduced to half.

After a presence of a DRM plus station is coarsely determined in a hybrid transmission mode, conventional receiver algorithms for find the symbol time, channel estimation, compensating for frequency and timing drifts, decoding the control and data channels may be used to make a determination if the station is actually a DRM plus station. Conventionally, a DRM plus station is detected by detecting the presence of an Orthogonal Frequency Division Multiplexing (OFDM) signal using correlation of guard period with the payload and the decoding the control information conveyed in Fast Access Channel (FAC). This process typically takes approximately 300 ms per channel per iteration (typically it takes more than one iteration to conclusively identify a channel as a DRM plus channel before marking a channel as non DRM channel). Therefore, by quickly identifying if a channel is “not” a DRM plus channel, the overall detection time can be reduced because the expensive fine detection process is then performed only on those channels there were coarsely identified as DRM plus channel previously.

In a radio receiver, broadcast bands are scanned frequently to identify AM, FM and DRM stations. In a modern radio receiver, the information obtained through the identification process is displayed on a user interface or display for a user. Identification of DRM stations is a relatively time consuming process when the entire broadcast spectrum needs to be scanned for the identification of DRM plus stations.

The embodiments disclosed herein make use of a two step process in which analog AM and FM tuners are used for making a list of possible DRM stations during the identification of AM and FM stations. In the second step, the DRM station identification process is then performed on this short list of possible DRM stations, thereby making the overall station identification process faster. Typically, it takes approximately 300 ms to determine if a particular station is a DRM station. A spectral band may contain 100+ stations, therefore it may take up to 30+ seconds to scan the entire spectral band to make a list of DRM stations. The embodiments described herein uses an analog tuner to identify an AM station or a FM station that takes approximately 30 ms per station. If a particular station is either AM or FM station, it cannot be a DRM station. This pre-exclusion of stations that are not DRM stations limits the DRM station identification routine to run on a limited number of stations, thus making the overall process faster.

FIG. 1 shows a simple block diagram of an improved radio receiver 100. As shown, the radio receiver 100 includes an analog tuner 102, a baseband processor 106, a memory 108 and a controller 110. The radio receiver 100 may also include a decoder 112 for decoding received digital transmission. The baseband processor 106 manages radio functions such as signal modulation/demodulation, encoding, radio frequency shifting, etc. The baseband processor 106 may include its own memory and an internal processor and can be built in a separate chip or may also be fabricated on a same chip as the controller 110. The baseband processor 106 may include preferably a real-time operating system stored in its own memory and to be executed by the internal processor of the baseband processor 106.

The analog tuner 102 is coupled to an antenna 116 and a speaker 118 via an audio driver 104. The analog tuner is used to receive AM/FM signals and based on a user selection of a station, one of the analog tuner 102 may receive programming from the selected station and play the programming on the speaker 118. The radio receiver 100 may include a user interface (UI) driver 114 to provide display signals to a user interface of the radio receiver 100. The audio driver 104 may convert signals received from the AM/FM tuners through driving a coil of the speaker 118, thus to convert electrical signals into sound waves.

In one example, the controller 100 performs overall coordination for playing a radio station by sending tune commands to the AM/FM tuners, and validating responses from the tuners to determine if the tuning is operational. The controller 110 may request the baseband processor 106 to send periodic notifications on signal quality and associated parameters. In some embodiments, the decoded radio signal is forwarded by the baseband processor 106 to the controller 110 for source decoding and for the final presentation of the decoded data (that may include, audio data and program information data including pictures and videos) to the speaker 118 or to the user interface. It should be noted that DRM plus stations use the same frequency band (or share part of the frequency band) of FM transmission.

Figure 2:
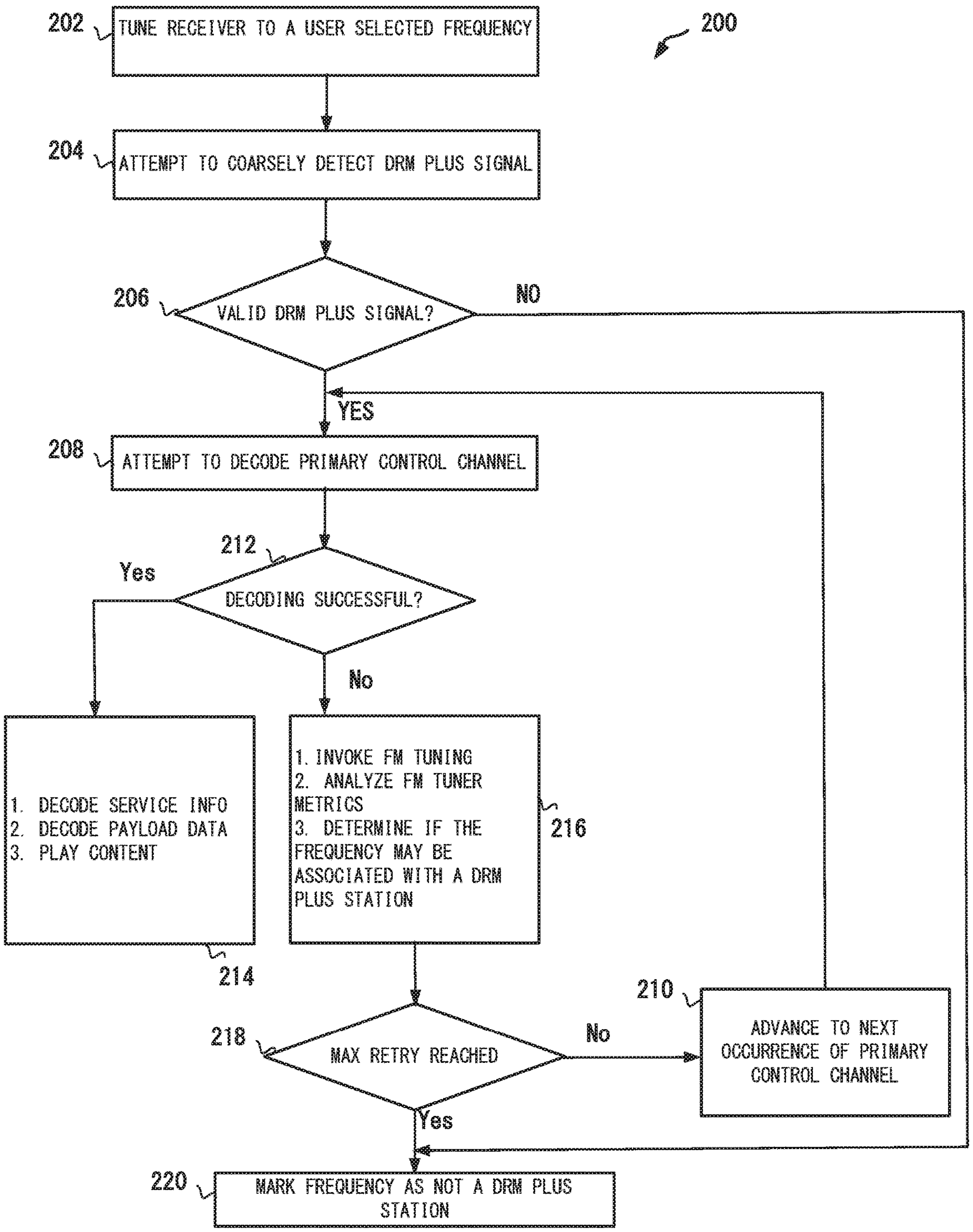
FIG. 2 shows a method of identifying DRM stations in accordance with one or more embodiments.

FIG. 2 shows a method 200 performed by the radio receiver 100 for efficiently identifying when a tuned frequency is associated with a FM station or a DRM plus station. Accordingly, at step 202, a user tunes the radio receiver 100 to a particular frequency. At step 204, the radio receiver 100 attempt to coarsely determine if the frequency is associated with a DRM plus station, as described above. For example, if a channel being analyzed exhibits higher modulation index than a typical FM channel or exhibits an erroneous metrics for ultrasound noise level the channel may be a DRM plus channel.

Ate decision step 206, if the frequency is coarsely determined to be associated with a DRM plus station, at step 208, the radio receiver 100 attempt to determine further if the frequency is associated with a DRM plus station by decoding primary control channel (e.g. FAC decoding). At decision step 212, the radio receiver 100 determines if the decoding is successful. If yes, at step 214, the service info and payload data is decoded and content is played. If at decision step 212, the decoding is not successful, at step 216, the radio receiver 100 attempts to invoke FM tuning and analyzes FM tuner metrics to determine if the frequency may still be a DRM plus station. If the analysis results in a successful determination that the frequency may be a DRM plus station and at decision step 218, if it is determined that max retries has not reached, the control moves to step 210 where next occurrence of primary control channel is set and the control moves to step 208 to repeat the process for a preselected retries before the frequency is conclusively identifies as associated with a DRM plus station. However, after the maximum tries have exhausted, at step 220, the frequency is marked as not a DRM plus station.

DRM uses COFDM (Coded Orthogonal Frequency Division Multiplexing) with QAM (Quadrature Amplitude Modulation). Removing “band pass noise” stations in the list of possible DRM station may involve attempting to decode the signal. Only a real DRM station will have signals that contains encoded data. Hence, multiple iterations may be needed to conclusively determine if the frequency is associated with a DRM plus station.

Some or all of these embodiments may be combined, some may be omitted altogether, and additional process steps can be added while still achieving the products described herein. Thus, the subject matter described herein can be embodied in many different variations, and all such variations are contemplated to be within the scope of what is claimed.

While one or more implementations have been described by way of example and in terms of the specific embodiments, it is to be understood that one or more implementations are not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

The use of the terms "a" and "an" and "the" and similar referents in the context of describing the subject matter (particularly in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims as set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

What is claimed is:

1. An analog tuner;

a baseband processor to provide radio functions, wherein the baseband processor is coupled to the analog tuner;

a memory; and a controller coupled to the analog tuner, the baseband processor and the memory, wherein the controller is configured to perform an operation, the operation includes causing the analog tuner to analyze a selected FM frequency to determine if the selected FM frequency is associated with a digital radio mondiale, DRM, plus station by first coarsely determine if the selected FM frequency may be associated with a DRM plus station and if coarse determination fails, marking the FM frequency as not being associated with a DRM plus station, wherein if the coarse determination is successful, retrying a selected number of times to continue to determine if the selected FM frequency is associated with a DRM plus station.

2. The analog tuner of claim 1, wherein the coarse determination is performed by determining if the selected FM frequency is not associated with a FM channel.

3. The analog tuner of claim 1, wherein if the coarse determination results in success, the operation further includes attempting to decode primary control channel.

4. The analog tuner of claim 3, wherein if the primary control channel decoding is successful, the operation further includes decoding service info and payload data.

5. The analog tuner of claim 4, wherein the operation further includes playing the decoded payload data on a speaker.

6. The analog tuner of claim 3, wherein if the primary control channel decoding fails, the operation further includes invoking FM tuning and analyzing tuner metrics to determine that the selected FM frequency may be associated with a DRM plus station.

7. The analog tuner of claim 6, wherein after analyzing, for a preselected number of times, the selected FM frequency for a DRM plus station using different occurrences of primary control channel each time, if a definite determination that the selected FM frequency is a DRM plus station fails, storing the selected FM frequency as a non DRM plus station in the memory.

* * * * *